United States Patent
Lim et al.

(10) Patent No.: US 8,890,179 B2
(45) Date of Patent: Nov. 18, 2014

(54) ORGANIC LIGHT-EMITTING DISPLAY APPARATUS

(75) Inventors: Jae-Ik Lim, Yongin (KR); Won-Sang Park, Yongin (KR); Yi-Joon Ahn, Yongin (KR); Gee-Bum Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 125 days.

(21) Appl. No.: 13/425,393

(22) Filed: Mar. 20, 2012

(65) Prior Publication Data

US 2013/0001600 A1    Jan. 3, 2013

(30) Foreign Application Priority Data

Jun. 29, 2011    (KR) .................. 10-2011-0064080

(51) Int. Cl.
*H01L 27/32* (2006.01)
*H01L 51/52* (2006.01)

(52) U.S. Cl.
CPC ......... *H01L 51/5265* (2013.01); *H01L 51/5234* (2013.01); *H01L 51/5218* (2013.01); *H01L 51/5281* (2013.01)
USPC .................. 257/88; 257/40; 257/E27.119

(58) Field of Classification Search
CPC .............. G02F 1/133634; G02F 1/133536; G02F 1/13362; G02F 2001/133543
USPC ........... 257/88, 98–100; 359/489.07; 349/117
See application file for complete search history.

(56) References Cited

U.S. PATENT DOCUMENTS

| | | | |
|---|---|---|---|
| 7,508,474 B2 | 3/2009 | Kashima | |
| 2003/0193635 A1* | 10/2003 | Mi et al. | 349/117 |
| 2005/0036093 A1* | 2/2005 | Maeda | 349/139 |
| 2006/0209239 A1 | 9/2006 | Lin | |
| 2008/0137014 A1* | 6/2008 | Toyama et al. | 349/119 |
| 2009/0034070 A1* | 2/2009 | Hara et al. | 359/487 |
| 2009/0295000 A1* | 12/2009 | Kim et al. | 264/1.34 |
| 2009/0296366 A1 | 12/2009 | Shikina et al. | |
| 2010/0156282 A1* | 6/2010 | Park et al. | 313/504 |
| 2010/0271575 A1 | 10/2010 | Ojima et al. | |

FOREIGN PATENT DOCUMENTS

| | | |
|---|---|---|
| JP | 2004-326089 A | 11/2004 |
| JP | 2010-256831 A | 11/2010 |
| KR | 10-2010-0025227 A | 3/2010 |
| KR | 10-2010-0063292 A | 6/2010 |
| KR | 10-2010-0079987 A | 7/2010 |

OTHER PUBLICATIONS

EPO Search Report dated Sep. 1, 2014, for corresponding European Patent application 12174487.4, (6 pages).

* cited by examiner

*Primary Examiner* — David Vu
*Assistant Examiner* — Jonathan Han
(74) *Attorney, Agent, or Firm* — Christie, Parker & Hale, LLP

(57) ABSTRACT

An organic light-emitting display apparatus includes an organic light-emitting device including a pixel electrode, an opposite electrode facing the pixel electrode, and an organic light-emitting layer interposed between the pixel electrode and the opposite electrode; a first polarization plate disposed on a surface of the organic light-emitting device, the organic light-emitting device being configured to emit light through the first polarization plate; a second polarization plate facing the first polarization plate; and an optical compensation member between the first polarization plate and the second polarization plate.

19 Claims, 9 Drawing Sheets

ORGANIC LIGHT-EMITTING DISPLAY APPARATUS

CROSS-REFERENCE TO RELATED PATENT APPLICATION

This application claims the benefit of Korean Patent Application No. 10-2011-0064080, filed on Jun. 29, 2011, in the Korean Intellectual Property Office, the entire disclosure of which is incorporated herein by reference.

BACKGROUND

1. Field

Embodiments of the present invention relate to an organic light-emitting display apparatus, and more particularly, to an organic light-emitting display apparatus reducing color shift at side-view angles.

2. Description of Related Art

Organic light-emitting display devices are attracting attention as next generation display devices because the organic light-emitting display devices are not only driven at low voltage, are light and thin, and have a wide viewing angle and excellent contrast, but also, have they quick response speeds.

In an organic light-emitting display device, when a voltage is applied between an anode and a cathode, electrons and holes are combined in an organic light emission layer disposed between the anode and the cathode so that excitons are formed therein and emit light while the excitons drop from an excited state to a ground state.

An organic light-emitting display device generally emits light in a wide range of wavelengths, thereby reducing luminous efficiency and reducing color purity. Because light emitted from an organic light-emitting layer has no directivity, many photons from among photons emitted in a direction do not reach a viewer due to total internal reflection, thereby reducing extraction efficiency of an organic light-emitting device. Thus, a resonance structure may be formed in an organic light-emitting display apparatus by using a distributed Bragg reflector (DBR) mirror or by adjusting a thickness of an organic layer. However, although luminous efficiency may be improved, color shift may occur at side-view angles. That is, a viewing angle of the organic light-emitting display apparatus may be reduced.

SUMMARY

Embodiments of the present invention provide an organic light-emitting display apparatus that includes an optical compensation member, thereby reducing color shift at side-view angles.

According to one embodiment of the present invention, an organic light-emitting display apparatus includes an organic light-emitting device including a pixel electrode, an opposite electrode facing the pixel electrode, and an organic light-emitting layer interposed between the pixel electrode and the opposite electrode; a first polarization plate disposed on a surface of the organic light-emitting device, the organic light-emitting device being configured to emit light through the first polarization plate; a second polarization plate facing the first polarization plate; and an optical compensation member between the first polarization plate and the second polarization plate.

An angle between an absorbing axis of the first polarization plate and an absorbing axis of the second polarization plate may be about 0 degrees.

The organic light-emitting display apparatus may further include a phase retardation layer interposed between the organic light-emitting device and the first polarization plate.

The phase retardation layer may include a single quarter wave plate.

The phase retardation layer may include a single quarter wave plate and a single half wave plate.

The organic light-emitting display apparatus may further include an encapsulation member between the organic light-emitting device and the phase retardation layer.

The optical compensation member may include at least one selected from the group consisting of an A-plate, a C-plate, a biaxial plate, and combinations thereof.

The A-plate is an optical member satisfying $nx \neq ny = nz$, the C-plate is an optical member satisfying $nx = ny \neq nz$, and the biaxial plate is an optical member satisfying $nx \neq ny \neq nz$. In addition, nx and ny are, respectively, refractive indexes of an x-axis direction and an y-axis direction from among reflective indexes of plate surfaces, nz is a refractive index of a thickness direction, and d is a thickness of a plate.

The optical compensation member may include two A-plates.

The two A-plates may be orthogonal to each other, and an in-plane retardation value of each of the two A-plates may be in a range from about 150 nm to about 300 nm.

An in-plane retardation value may be defined according to Equation below:

$$Rin = d^*(nx - ny)$$

The optical compensation member may include a single A-plate.

An in-plane retardation value of the A-plate may be in a range from about 500 nm to about 700 nm.

The optical compensation member may include a single C-plate.

A thickness retardation value of the C-plate may be in a range from about 150 nm to about 250 nm.

A thickness retardation value may be defined according to Equation below:

$$Rth = [\{(nx+ny)/2\} - nz]^*d$$

The optical compensation member may include a single biaxial plate.

An in-plane retardation value of the biaxial plate may be in a range from about 100 nm to about 150 nm.

The optical compensation member may include two biaxial plates.

The two biaxial plates may be orthogonal to each other, and an in-plane retardation value of each of the two biaxial plates may be in a range from about 50 to about 300 nm.

The optical compensation member may include a single A-plate and a C-plate that are sequentially disposed along a direction away from the organic light-emitting device.

The optical compensation member may include a single biaxial plate and a single C-plate that are sequentially disposed along a direction away from the organic light-emitting device.

The optical compensation member may include a single A-plate and a single biaxial plate that are sequentially disposed along a direction away from the organic light-emitting device.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
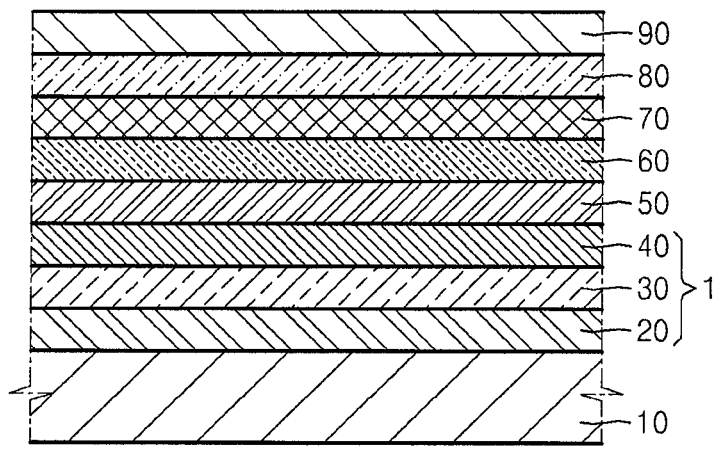
FIG. 1 is a schematic cross-sectional view of an organic light-emitting display apparatus according to an embodiment of the present invention.

Hereinafter, the present invention will be described in detail by explaining exemplary embodiments thereof with reference to the attached drawings. Throughout this specification, the terms for indicating angles, such as "45 degrees", "orthogonal", "identical" or the like include angles that are substantially the same as a corresponding angle as well as the corresponding angle. Like reference numerals in the drawings denote like elements. As used herein, the term "and/or" includes any and all combinations of one or more of the associated listed items.

FIG. 1 is a schematic cross-sectional view of an organic light-emitting display apparatus according to an embodiment of the present invention.

Referring to FIG. 1, the organic light-emitting display apparatus according to one embodiment includes an organic light-emitting device 1 including a pixel electrode 20, an opposite electrode 40 facing the pixel electrode 20, and an organic emissive layer 30 interposed between the pixel electrode 20 and the opposite electrode 40, which are disposed on a substrate 10, an encapsulation member 50 for encapsulating the organic light-emitting device 1, and a phase retardation layer 60, a first polarization plate 70, an optical compensation member 80, and a second polarization plate 90 which are sequentially formed in the stated order on the encapsulation member 50.

The substrate 10 may be formed of a glass material containing $SiO_2$ as a main component, but is not limited thereto. That is, the substrate 10 may be formed of various materials such as metal or plastic. A buffer layer may be formed between the substrate 10 and the pixel electrode 20 in order to planarize the substrate 10 and to reduce or prevent the penetration of impurities, and may be formed of $SiO_2$ and/or SiNx.

The pixel electrode 20 may be disposed on the substrate 10. The pixel electrode 20 may be a reflective electrode, and may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), and combinations thereof, and a transparent electrode layer formed on the reflective layer.

The transparent electrode layer may include at least one material selected from the group consisting of indium tin oxide (ITO), indium zinc oxide (IZO), zinc oxide (ZnO), indium oxide ($In_2O_3$), indium gallium oxide (IGO), aluminum zinc oxide (AZO), and combinations thereof.

A plurality of the reflective layers and/or the transparent electrode layers may be stacked. That is, a reflective layer may be interposed between a pair of transparent electrode layers.

The substrate 10 may further include a pixel circuit unit including a thin film transistor (TFT). The pixel circuit unit, in particular, the TFT, may be electrically connected to the pixel electrode 20.

The organic emissive layer 30 is formed on the pixel electrode 20. The organic emissive layer 30 may be formed of a low molecular weight organic material or a high molecular weight organic material.

When the organic emissive layer 30 is formed of a low molecular weight organic material, a hole transport layer (HTL), a hole injection layer (HIL), an organic emission layer (EML), an electron transport layer (ETL), and an electron injection layer (EIL) may be stacked. If necessary, various other layers may be stacked. In this case, examples of organic materials that may be used to form the organic emissive layer 30 include any of various materials such as copper phthalocyanine (CuPc), N,N'-di(naphthalene-1-yl)-N,N'-diphenyl-benzidine (NPB), and tris-8-hydroxyquinoline aluminum (Alq3).

When the organic emissive layer 30 is formed of a high molecular weight organic material, the organic emissive layer 30 may include at least an HTL in addition to an EML. In this case, the HTL may be formed of poly(3,4-ethylenedioxythiophene) (PEDOT), polyaniline (PANI), or the like. In addition, the organic EML may clued a poly-phenylene vinylene(PPV)-based high molecular weight organic material and a polyfluorene-based high molecular weight organic material, or the like.

In one embodiment of the present invention, the opposite electrode 40 is disposed on the organic emissive layer 30. In the organic light-emitting display apparatus according to one embodiment of the present invention, the pixel electrode 20 serves as an anode, and the opposite electrode 40 serves as a cathode, but embodiments of the present invention are not limited thereto That is, the pixel electrode 20 may serve as a cathode, and the opposite electrode 40 may serve as an anode.

When the pixel electrode 20 is a reflective electrode, the opposite electrode 40 may be a transparent electrode. In this case, a semi-transparent electrode structure may be formed by depositing a metal having a low work function, for example, a material selected from the group consisting of lithium (Li), calcium (Ca), LiF/Ca, LiF/Al, Al, Mg, Ag, and combinations thereof, as a metal thin film. An auxiliary electrode layer or a bus electrode may be further formed of a material for forming a transparent electrode, such as ITO, IZO, ZnO, or $In_2O_3$ on the metal thin film. A bus line may be further formed by forming a thicker layer of metal with excellent conductivity in a region other than an emissive region.

The encapsulation member 50 may be an organic, a glass, or a plastic substrate though which light is capable of being transmitted. The encapsulation member 50 may be a stack structure formed by stacking a thin film formed of an organic material and a thin film formed of an inorganic material.

The above-described structure refers to a top emission type organic light-emitting display apparatus in which light emitted from the organic emissive layer 30 proceeds toward the opposite electrode 40.

In the organic light-emitting display apparatus of FIG. 1, the phase retardation layer 60 is disposed on the encapsulation member 50, and the first polarization plate 70 is disposed on the phase retardation layer 60. The first polarization plate 70 is an optical member for converting incident light into linear polarized light by transmitting having a polarization (e.g., a predetermined direction or a predetermined polarization), e.g., with a transmission-axis direction.

In one embodiment of the present invention, the phase retardation layer 60 and the first polarization plate 70 physically contact each other, and a combination of the phase retardation layer 60 and the first polarization plate 70 reduce or prevent external light from being reflected.

The phase retardation layer 60 may be a single quarter wave plate. An angle between an optical axis of the quarter wave plate and an absorbing axis of the first polarization plate 70 may be about 45 degrees. Through the above-described structure, a light beam that is linearly polarized in one direction through the first polarization plate 70 is converted into circularly polarized light through the quarter wave plate. When the circularly polarized light is reflected from the organic light-emitting device 1, the circularly polarized light is converted into linear polarized light through the quarter wave plate.

In this case, because light that is incident from outside and that is linearly polarized through the first polarization plate 70 is orthogonal to light that is linearly polarized again through the quarter wave plate, reflective light may not be transmitted through the first polarization plate 70, thereby preventing external light entering the apparatus from outside from being emitted back to the outside.

A structure for reducing or preventing external light from being reflected is not limited to the above-described structure, and may be changed in various ways. For example, the phase retardation layer 60 may include a single half wave plate disposed below the first polarization plate 70, and a single quarter wave plate disposed below the half wave plate. In this case, angles between a slow axis of the half wave plate and a transmission axis of the first polarization plate 70 may be θ+15+α, θ−15+α, θ+75+α, and θ−75+α. In addition, angles between a slow axis of the quarter wave plate and the transmission axis of the first polarization plate 70 may be θ+75+α, θ−75+α, θ+15+α, or θ−15+α. The four angles of the half wave plate and the four angles of the quarter wave plate correspond to each other, respectively. In one embodiment, a indicates ±10 degrees.

In one embodiment of the present invention, the second polarization plate 90 is disposed on the first polarization plate 70, and the optical compensation member 80 is interposed between the first polarization plate 70 and the second polarization plate 90.

The second polarization plate 90 is an optical member for converting incident light into linear polarized light by transmitting light having a polarization aligned with a transmission axis, and is arranged so an absorbing axis of the second polarization plate 90 is aligned with an absorbing axis of the first polarization plate 70.

The optical compensation member 80 may include at least one of an A-plate, a C-plate, a biaxial plate, and combinations thereof. The A-plate, the C-plate, and the biaxial plate are defined as follows:

When a refractive index of an x-axis direction is nx, a refractive index of a y-axis direction is ny from among refractive indexes of plate surfaces that are orthogonal to each other, and a refractive index of a thickness direction is nz, the A-plate is an optical member satisfying nx≠ny=nz, and the C-plate is an optical member satisfying nx=ny≠nz. The biaxial plate is an optical member having two optical axes, and satisfies nx≠ny≠nz.

The above plates have an in-plane retardation value and a thickness retardation value, which are defined according to Equations 1 and 2 below.

$$Rin = d*(nx-ny) \quad (1)$$

$$Rth = [\{(nx+ny)/2\} - nz]rd \quad (2)$$

In this case, d is a thickness of a plate, Rin is an in-plane retardation value, and Rth is a thickness retardation value.

Thus, the A-plate and the biaxial plate have both an in-plane retardation value and a thickness retardation value. However, the C-plate has a thickness retardation value only, and an in-plane retardation value of the C-plate is about 0.

The in-plane retardation value and the thickness retardation value may have an error value of about ±10 nm due to external influences, or the like.

As described above, the optical compensation member 80 may include at least one of the A-plate, the C-plate, the biaxial plate, and combinations thereof. By adjusting the combination, materials for forming the A-plate, the C-plate, and the biaxial plate, and the thickness d of each plate, phase retardation value of light transmitted through the optical compensation member 80 may be adjusted.

Figure 2:
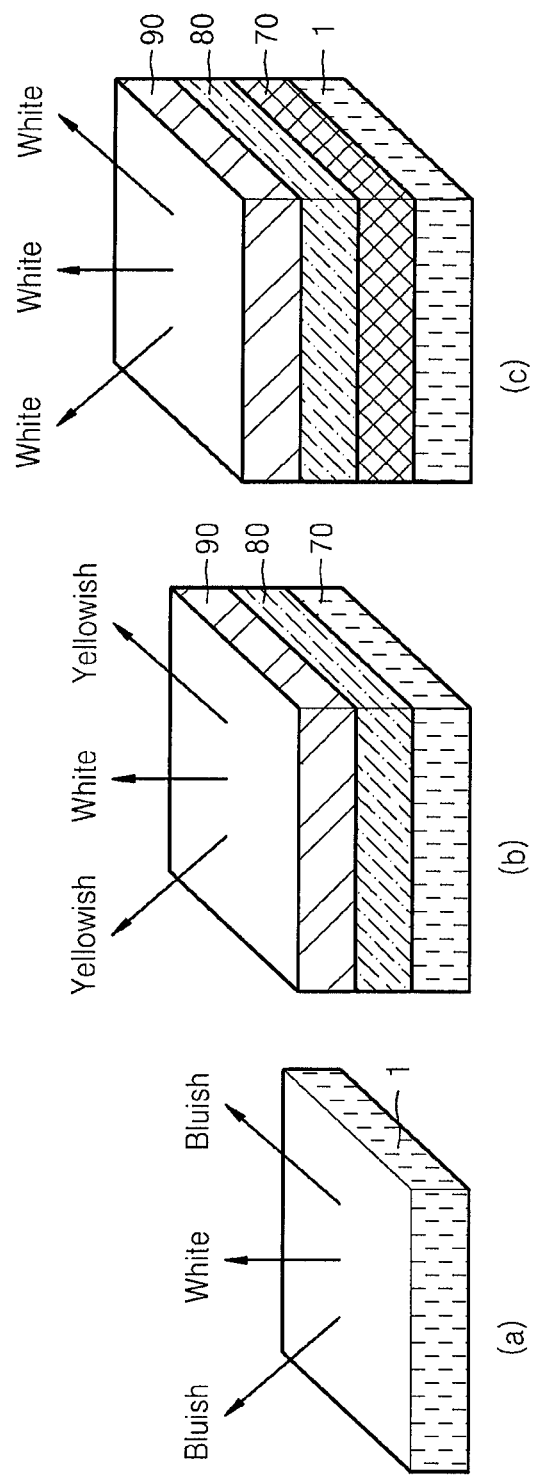
FIG. 2 is a conceptual diagram illustrating a principle of compensating color shift at side-view angles of an organic light-emitting display apparatus, according to an embodiment of the present invention.

FIG. 2 is a conceptual diagram for describing a principle of compensating for color shift at side-view angles of an organic light-emitting display apparatus, according to an embodiment of the present invention.

Referring to FIG. 2, (a) shows a case where light is emitted from an organic light-emitting display apparatus 1 without an optical compensation member 80, (b) shows a case where light is transmitted through the optical compensation member 80, and (c) shows a case where light is emitted from an organic light-emitting display apparatus 1 including the optical compensation member 80.

In the organic light-emitting display apparatus 1 without the optical compensation member 80, light, which is realized as white light viewed from the front of the organic light-emitting display apparatus is shifted towards a bluish side viewed from a side of the organic light-emitting display apparatus due to a resonance structure used to increase luminous efficiency (see, e.g., FIG. 2(*a*)). In order to compensate for this, a first polarization plate 70 and a second polarization plate 90 are disposed on the organic light-emitting display apparatus, and the optical compensation member 80 for shifting light towards a yellow side viewed from a side of the organic light-emitting display apparatus is disposed between the first polarization plate 70 and the second polarization plate 90 (see, e.g., FIG. 2(*c*)).

Through the above-described structure, the blue shift of the organic light-emitting display apparatus is compensated for by the optical compensation member 80. Thus, when the organic light-emitting display apparatus is viewed from a side, white light may also be realized, which is the same as in a case where the organic light-emitting display apparatus is viewed from the front of the organic light-emitting display apparatus (see, e.g., FIG. 2(*c*)).

In more detail, the optical compensation member 80 such as an A-plate, a C-plate, or a biaxial plate may cause in-plane retardation and/or thickness retardation.

In this case, light that is squarely emitted from the organic light-emitting display apparatus and light that is obliquely emitted from the organic light-emitting display apparatus proceeds along different paths of the optical compensation member 80. For example, when a thickness of the optical compensation member 80 is d, light that is squarely emitted proceeds by a distance d. However, light that is obliquely emitted at an angle of ϕ with respect to the front of the organic light-emitting display apparatus, the light proceeds by a distance d/cos ϕ. The distance d/cos ϕ may be resolved into an in-plane distance d*tan ϕ and a thickness distance d.

In this case, according to a type and thickness d of the optical compensation member 80, in-plane retardation and thickness retardation with values (e.g., predetermined values) may occur. That is, phase retardation with a desired thickness may be induced at a side of the organic light-emitting display apparatus by appropriately combining nx, ny, nz, and the thickness d of the A-plate and the biaxial plate having both an in-plane retardation value and a thickness retardation value, and the C-plate having only a thickness retardation value.

Because the first polarization plate 70 and the second polarization plate 90 are disposed below and above the optical compensation member 80, respectively, phase retardation of light transmitted through the first polarization plate 70 may occur with a value (e.g., a predetermined value). While the light is transmitted through the second polarization plate 90 again, transmittance of light is adjusted according to its wavelength, and thus a color shift may occur at a side of the organic light-emitting display apparatus.

In the organic light-emitting display apparatus, color shift of the optical compensation member 80 may be induced in order to compensate for a blue shift that occurs at a side of the organic light-emitting display apparatus, thereby compensating for a shift at an inclination angle with respect to the front of the organic light-emitting display apparatus. Thus, a viewing angle of the organic light-emitting display apparatus may be increased.

Figure 3:
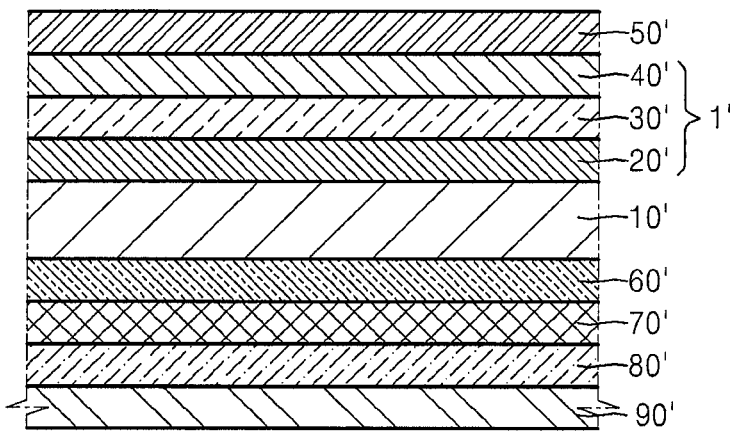
FIG. 3 is a schematic cross-sectional view of an organic light-emitting display apparatus according to another embodiment of the present invention.

FIG. 3 is a schematic cross-sectional view of an organic light-emitting display apparatus according to another embodiment of the present invention.

Referring to FIG. 3, the organic light-emitting display apparatus according to the present embodiment includes an organic light-emitting device 1' including a pixel electrode 20', an opposite electrode 40' facing the pixel electrode 20', and an organic emissive layer 30' interposed between the pixel electrode 20' and the opposite electrode 40', which are disposed on a substrate 10', an encapsulation member 50' for encapsulating the organic light-emitting device 1', and a phase retardation layer 60', a first polarization plate 70', an optical compensation member 80', and a second polarization plate 90' which are sequentially formed in the stated order below the substrate 10'.

The organic light-emitting display apparatus of FIG. 3 is the same as the organic light-emitting display apparatus of FIG. 1 except for materials for forming the pixel electrode 20' and the opposite electrode 40', and a position of the optical compensation member 80'. Hereinafter, the organic light emitting display apparatus according to one embodiment of the present invention will be described in terms of differences from the organic light emitting display apparatus of FIG. 1.

The pixel electrode 20' is disposed on the substrate 10'. The pixel electrode 20' may be a transparent or semi-transparent electrode. In this case, the pixel electrode 20' may include at least one material selected from the group consisting of ITO, IZO, ZnO, $In_2O_3$, IGO, and AZO.

The organic emissive layer 30' is formed on the pixel electrode 20'. The organic emissive layer 30' may be formed of a low molecular weight organic material or a high molecular weight organic material.

The opposite electrode 40' is disposed on the organic emissive layer 30'. The opposite electrode 40' may be a reflective electrode. In this case, the opposite electrode 40' may be formed by depositing a material selected from the group consisting of Li, Ca, LiF/Ca, LiF/Al, Al, Ag, Mg, and combinations thereof on an entire surface of the organic emissive layer 30'.

In the organic light-emitting display apparatus of the embodiment shown in FIG. 3, the pixel electrode 20' is a transparent electrode, and the opposite electrode 40' is a reflective electrode. Thus, the organic light-emitting display apparatus is a bottom emission type organic light-emitting display apparatus in which light emitted from the organic emissive layer 30' proceeds towards the substrate 10' through the pixel electrode 20'.

Thus, the phase retardation layer 60', the first polarization plate 70', the optical compensation member 80', and the second polarization plate 90' are sequentially stacked in the stated order at a side of the substrate 10' through which light is transmitted. According to a method substantially similar to that of a top emission type organic light-emitting display apparatus, external light may be reduced or prevented from being reflected and a color shift at a side may be compensated for.

Hereinafter, examples of the optical compensation member 80 according to the above-described method will be described.

First Embodiment

Figure 4:
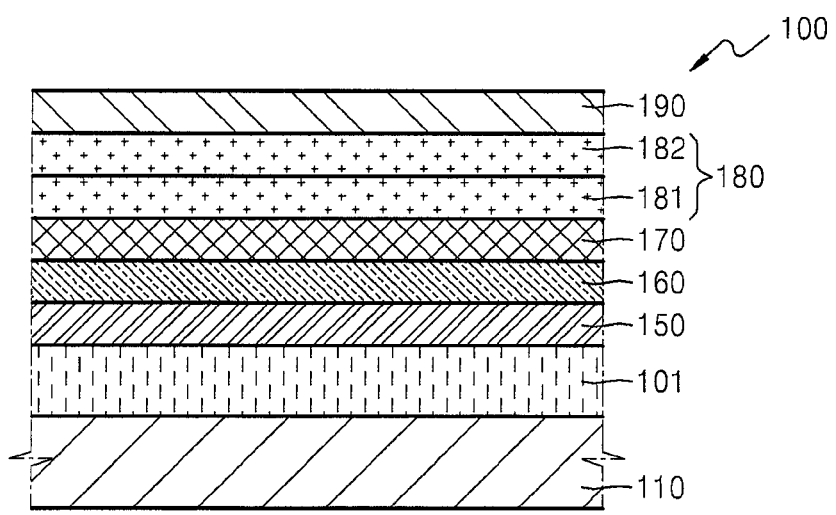
FIGS. 4, 6, 8, 10, and 12 through 15 are cross-sectional views of organic light-emitting display apparatuses according to embodiments of the present invention.
Figure 5:
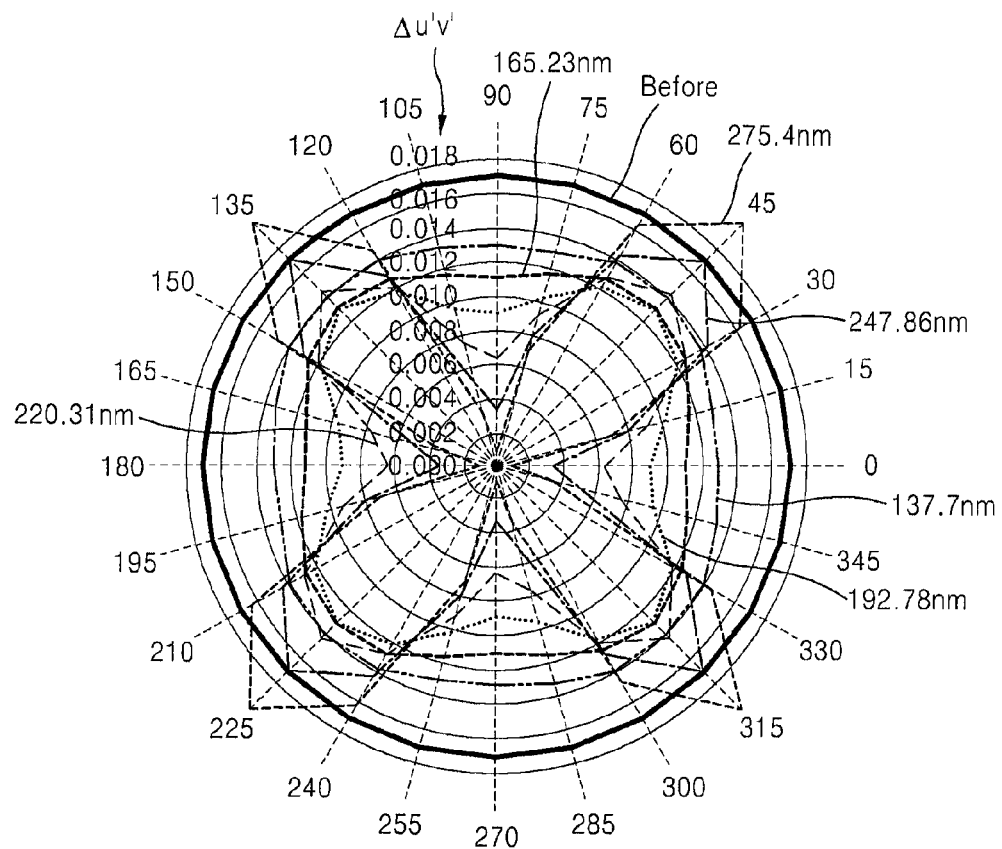
FIGS. 5, 7, 9, and 11 show color shift at side-view angles of organic light-emitting display apparatuses according to embodiments of the present invention.

FIG. 4 is a schematic cross-sectional view of an organic light-emitting display apparatus 100 according to an embodiment of the present invention. FIG. 5 shows color shift at side-view angles of the organic light-emitting display apparatus 100 of FIG. 4.

Referring to FIG. 4, according to one embodiment of the present invention, a quarter wave plate 160, a first polarization plate 170, an A-plate 180, and a second polarization plate 190 are sequentially stacked in the stated order on an organic light-emitting device 101. An encapsulation member 150 may be further imposed between the organic light-emitting device 101 and the quarter wave plate 160. The A-plate 180 may include a lower A-plate 181 and an upper A-plate 182.

The quarter wave plate 160 and the first polarization plate 170 are arranged so that an angle between a slow axis of the quarter wave plate 160 and an absorbing angle of the first polarization plate 170 is about 45 degrees. The quarter wave plate 160 and the first polarization plate 170 reduce or prevent external light from being reflected, as described above, and thus a detailed description thereof will be omitted here.

The first polarization plate 170 and the second polarization plate 190 are arranged so that an angle between the absorbing axis of the first polarization plate 170 and an absorbing axis of the second polarization plate 190 may be about 0 degrees. An angle between a slow axis of the lower A-plate 181 and the absorbing axis of each of the first polarization plate 170 and the second polarization plate 190 may be about 45 degrees. Slow axes of the upper A-plate 182 and the lower A-plate 181 are orthogonal to each other. That is, an angle between the absorbing axis of the upper A-plate 182 and the absorbing axis of each of the first polarization plate 170 and the second polarization plate 190 is about 135 degrees.

In this case, an angle between the lower A-plate 181 and the absorbing axis of the first polarization plate 170 may be 135 degrees, and an angle between the upper A-plate 182 and the absorbing axis of the first polarization plate 170 may be 45 degrees.

However, an angle between the A-plate 180 and the first polarization plate 170 is not limited to the above-described angle.

An in-plane retardation value Rin of each of the lower and upper A-plates 181 and 182 may be in a range from about 150 nm to about 300 nm. For example, in one embodiment, the in-plane retardation value Rin is in a range from about 200 nm to about 250 nm.

FIG. 5 shows simulation results of color shift at side-view angles of the organic light-emitting display apparatus 100 according to the in-plane retardation value Rin of each of the lower and upper A-plates 181 and 182.

In this case, an angle φ at which light is inclined to the front of the organic light-emitting display apparatus 100 is 60 degrees, and the in-plane retardation value Rin of each of the lower and upper A-plates 181 and 182 may be in a range from about 150 nm to about 250 nm. The simulation results are related to a case where the in-plane retardation values Rin of the lower and upper A-plates 181 and 182 are the same. Alternatively, the in-plane retardation values Rin of the lower and upper A-plates 181 and 182 may be different. The numbers shown in FIG. 5, such as 0, 15, 30, and the like refer to an angle between a line from a region corresponding to a case where light is inclined to the front of the organic light-emitting display apparatus 100 at 60 degrees from a center corresponding to the front of the organic light-emitting display apparatus 100 and a line from another region corresponding to a case where light is inclined to the front of the organic light-emitting display apparatus 100 at 60 degrees to the center on a plane of the organic light-emitting display apparatus.

Lines that extend in a radial direction from the center refer to color variation (Δu'v') at a side with respect to the front. A color variation value is increased away from the center according to a distance. In this case, u' and v' refer to color coordinates and color differences in color coordinate space, respectively. The numbers shown in FIG. 5 will be omitted in other embodiments described below.

According to the simulation results, the color variation (Δu'v') of the organic light-emitting display apparatus according to the first present embodiment is reduced compared to a case without the optical compensation member 80. That is, a viewing angle is increased by the optical compensation member 80.

Second Embodiment

Figure 6:
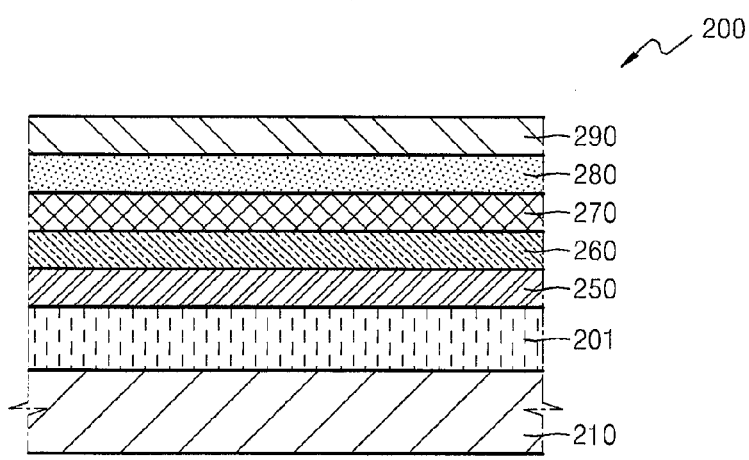
Figure 7:
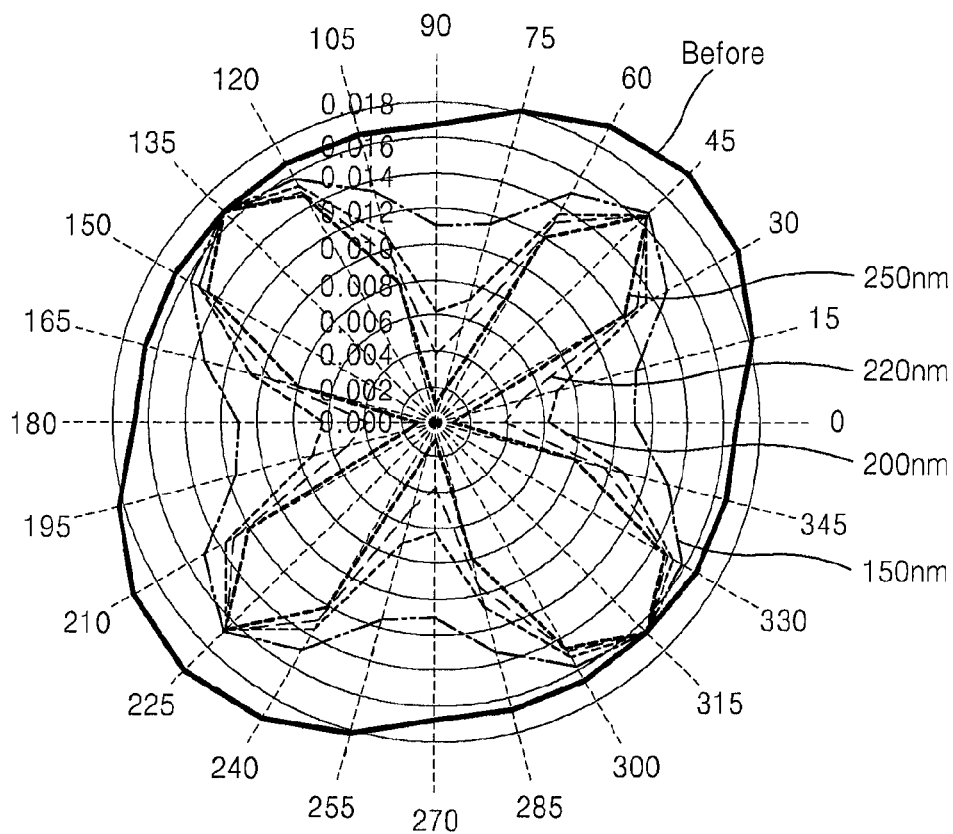

FIG. 6 is a schematic cross-sectional view of an organic light-emitting display apparatus 200 according to a second embodiment of the present invention. FIG. 7 shows color shift at side-view angles of the organic light-emitting display apparatus 200 of FIG. 6.

Referring to FIG. 6, a quarter wave plate 260, a first polarization plate 270, a C-plate 280, and a second polarization plate 290 are stacked in the stated order on an organic light-emitting device 201.

The quarter wave plate 260 and the first polarization plate 270 are arranged so that an angle between a slow axis of the quarter wave plate 260 and an absorbing angle of the first polarization plate 270 is about 45 degrees.

The first polarization plate 270 and the second polarization plate 290 may be arranged so that an angle between absorbing axes of the first polarization plate 270 and the second polarization plate 290 may be about 0 degrees.

A thickness retardation value Rth of the C-plate 281 may be in a range from about 150 nm to about 250 nm. In one embodiment the thickness retardation value Rth is in a range from about 200 nm to about 250 nm.

FIG. 7 shows simulation results of color shift at side-view angles according to a thickness retardation value Rth of the C-plate 280.

In this case, an angle φ at which light is inclined to the front of the organic light-emitting display apparatus 200 is 60 degrees, and the thickness retardation value Rth of the C-plate 281 is in a range from about 150 nm to about 250 nm.

Third Embodiment

Figure 8:
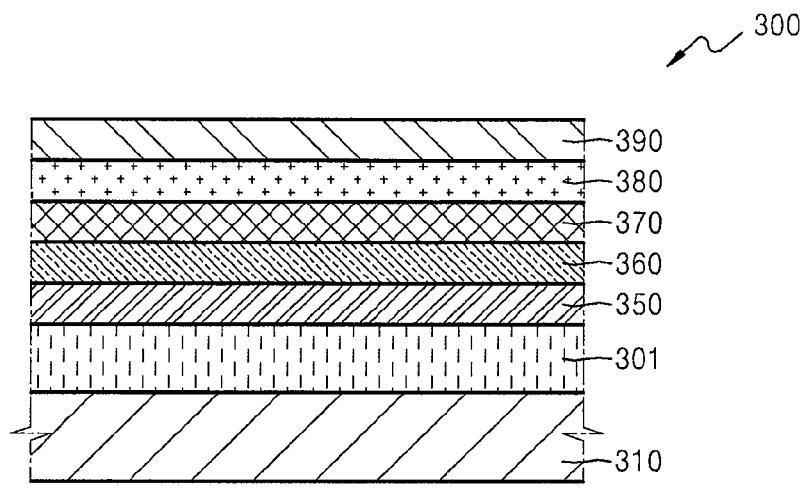
Figure 9:
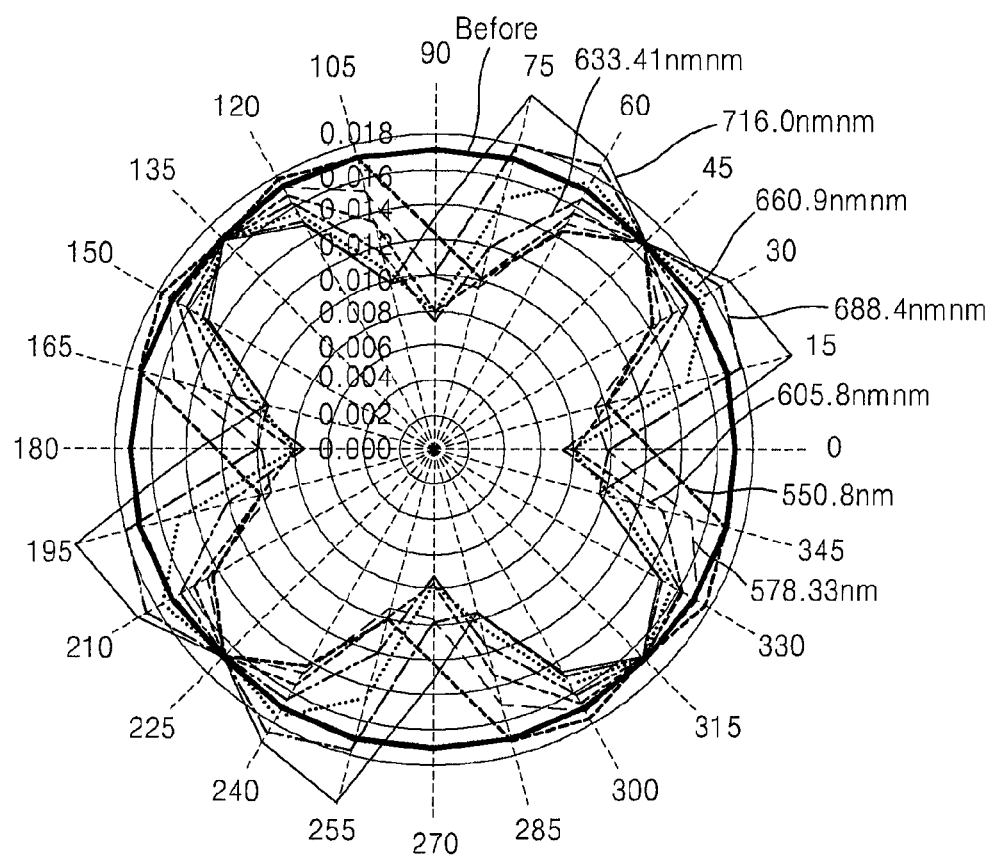

FIG. 8 is a schematic cross-sectional view of an organic light-emitting display apparatus 300 according to an embodiment of the present invention. FIG. 9 shows color shift at side-view angles of the organic light-emitting display apparatus 300 of FIG. 8.

Referring to FIG. 8, a quarter wave plate 360, a first polarization plate 370, an A-plate 380, and a second polarization plate 390 are stacked in the stated order on an organic light-emitting device 301.

The quarter wave plate 360 and the first polarization plate 370 are arranged so that an angle between a slow axis of the quarter wave plate 360 and an absorbing angle of the first polarization plate 370 may be about 45 degrees.

The first polarization plate 370 and the second polarization plate 390 are arranged so that an angle between absorbing axes of the first polarization plate 370 and the second polarization plate 390 may be about 0 degrees. An angle between a slow axis of the A-plate 380 and the absorbing axis of each of the first polarization plate 370 and the second polarization plate 390 is about 90 degrees.

However, the angle between the A-plate 380 and the first polarization plate 370 is not limited to the above-described angle.

An in-plane retardation value Rin of the A-plate 380 may be in a range from about 500 nm to about 700 nm. For example, in one embodiment, the in-plane retardation value Rin is in a range from about 600 nm to about 660 nm.

FIG. 9 shows simulation results of color shift at side-view angles according the in-plane retardation value Rin of the A-plate 380.

In this case, an angle φ at which light is inclined to the front of the organic light-emitting display apparatus 300 is 60 degrees, and the in-plane retardation value Rin of the A-plate 380 is in a range from about 550 nm to about 720 nm.

Fourth Embodiment

Figure 10:
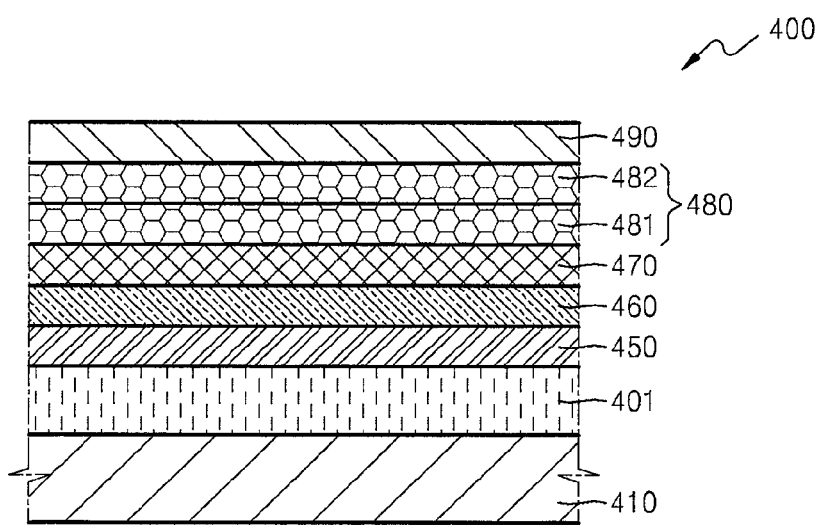
Figure 11:
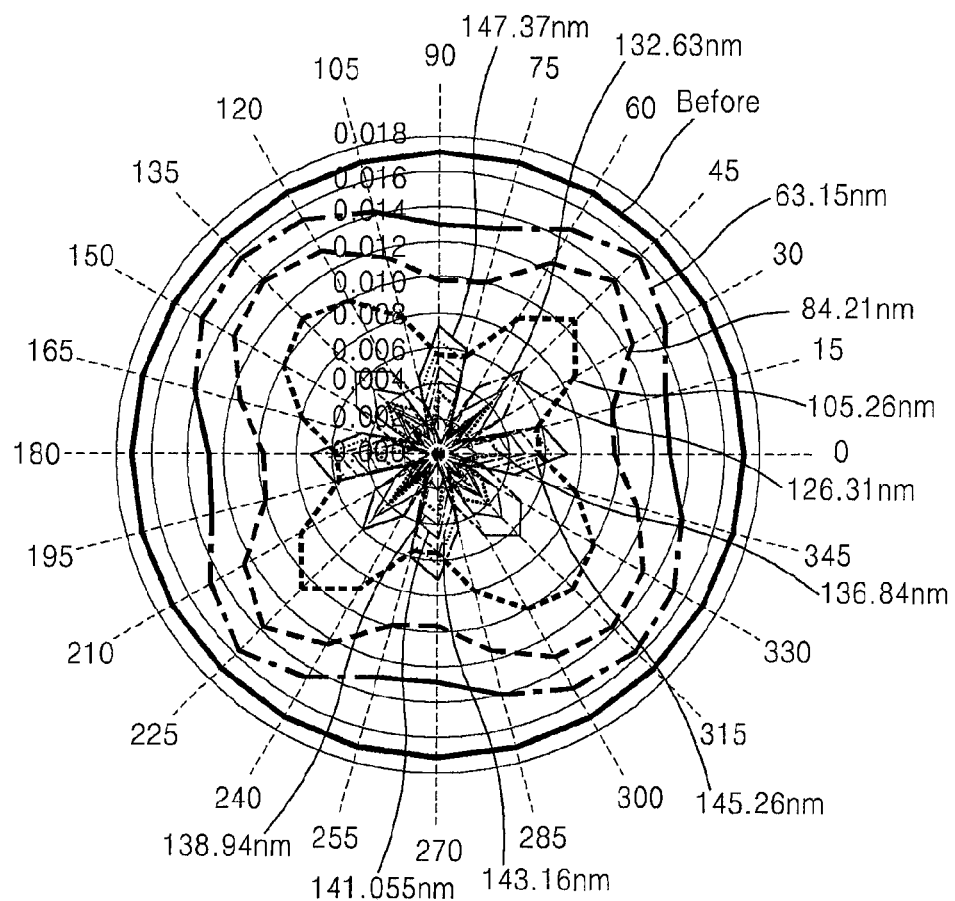

FIG. 10 is a schematic cross-sectional view of an organic light-emitting display apparatus 400 according to an embodiment of the present invention. FIG. 11 shows color shift at side-view angles of the organic light-emitting display apparatus 400 of FIG. 10.

Referring to FIG. 10, a quarter wave plate 460, a first polarization plate 470, a lower biaxial plate 481, an upper biaxial plate 482, and a second polarization plate 490 are sequentially stacked in the stated order on an organic light-emitting device 401.

The quarter wave plate 460 and the first polarization plate 470 are arranged so that an angle between a slow axis of the quarter wave plate 460 and an absorbing angle of the first polarization plate 470 may be about 45 degrees.

An angle between the absorbing axes of the first polarization plate 470 and the second polarization plate 490 may be about 0 degrees. An angle between a slow axis of the lower biaxial plate 481 and the absorbing axis of each of the first polarization plate 470 and the second polarization plate 490 is about 45 degrees. The slow axes of the upper biaxial plate 482 and the lower biaxial plate 481 are orthogonal to each other. That is, an angle between the slow axis of the upper biaxial plate 482 and the absorbing axis of each of the first polarization plate 470 and the second polarization plate 490 is about 135 degrees.

In this case, an angle between the slow axis of the lower biaxial plate 481 and the absorbing axis of the absorbing axis of the first polarization plate 470 may be about 135 degrees, and an angle between the slow axis of the upper biaxial plate 482 and the absorbing axis of the first polarization plate 470 may be about 45 degrees.

However, an angle between each of the lower and upper biaxial plates 481 and 482 and the first polarization plate 470 may not be limited to the above-described angle.

An in-plane retardation value Rin of each of the lower and upper biaxial plates 481 and 482 may be in a range from about 50 nm to about 300 nm. For example, in one embodiment the in-plane retardation value Rin is in a range from about 100 nm to about 150 nm. In addition, Nz for indicating a biaxial degree of each of the lower and upper biaxial plates 481 and 482 may be from about 1.4 to about 1.8. Nz may be defined according to Equation 3 below.

$$Nz = Rth/Rin \quad (3)$$

In this case, Rin is an in-plane retardation value, and Rth is a thickness retardation value.

FIG. 11 shows simulation results of color shift at side-view angles of the organic light-emitting display apparatus 400 according to the in-plane retardation value Rin of each of the lower and upper biaxial plates 481 and 482.

In this case, an angle φ at which light is inclined to the front of the organic light-emitting display apparatus 400 is 60 degrees, Nz is 1.6, and the in-plane retardation value Rin of each of the lower and upper biaxial plates 481 and 482 is in a range from about 50 nm to about 150 nm.

Fifth Embodiment

Figure 12:
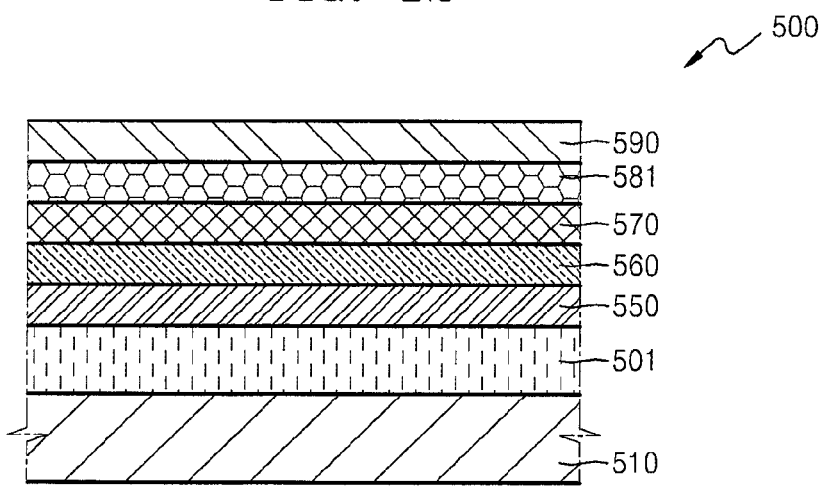

FIG. 12 is a schematic cross-sectional view of an organic light-emitting display apparatus 500 according to an embodiment of the present invention. Referring to FIG. 12, a quarter wave plate 560, a first polarization plate 570, a biaxial plate 581, and a second polarization plate 590 are sequentially stacked in the stated order on an organic light-emitting device 501.

The quarter wave plate 560 and the first polarization plate 570 are arranged so that an angle between a slow axis of the quarter wave plate 560 and an absorbing axis of the first polarization plate 570 may be about 45 degrees.

The first polarization plate 570 and the second polarization plate 590 are arranged so that an angle between absorbing axes of the first polarization plate 570 and the second polarization plate 590 may be about 0 degrees. An angle between a slow axis of the biaxial plate 581 and the absorbing angle of the first polarization plate 570 and the second polarization plate 590 may be in a range from about 0 to about 90 degrees, and, in one embodiment, is at about 90 degrees.

An in-plane retardation value Rin of the biaxial plate 581 may be in a range from about 100 nm to about 150 nm, and, in one embodiment, from about 100 nm to about 120 nm.

Sixth Embodiment

Figure 13:
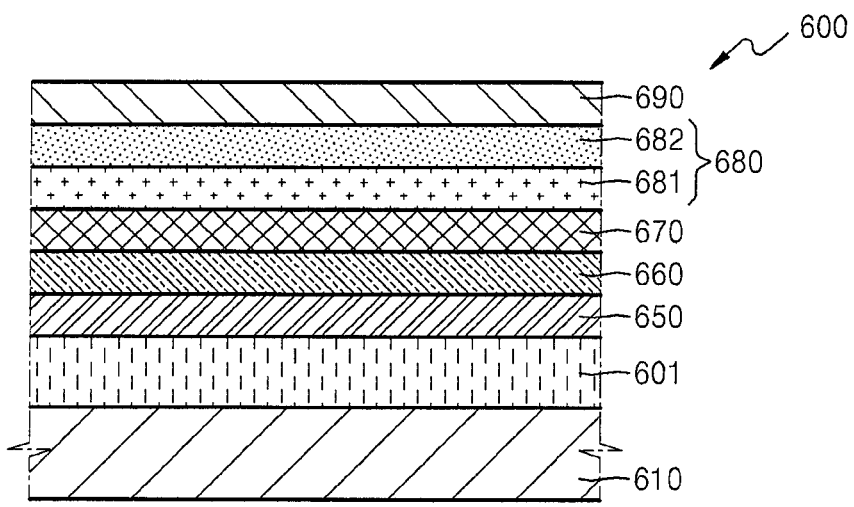

FIG. 13 is a schematic cross-sectional view of an organic light-emitting display apparatus 600 according to another embodiment of the present invention.

Referring to FIG. 13, a quarter wave plate 660, a first polarization plate 670, an A-plate 681, a C-plate 682, and a second polarization plate 690 are sequentially stacked in the stated order on an organic light-emitting device 601.

The quarter wave plate 660 and the first polarization plate 670 may be arranged so that an angle between a slow axis of the quarter wave plate 660 and an absorbing angle of the first polarization plate 670 may be about 45 degrees.

An angle between absorbing axes of the first polarization plate 670 and the second polarization plate 690 may be about 0 degrees. An angle between a slow angle of the A-plate 681 and the absorbing axis of each of the first polarization plate 670 and the second polarization plate 690 may be in a range from about 0 degrees to about 90 degrees, and, in one embodiment, is at 90 degrees.

In this case, an in-plane retardation value Rin of the A-plate 681 may be in a range from about 100 nm to about 300 nm, and, in one embodiment, is in a range from about 200 nm to about 250 nm. In addition, a thickness retardation value Rth of the C-plate 682 may be in a range from about 50 nm to about 300 nm.

Seventh Embodiment

Figure 14:
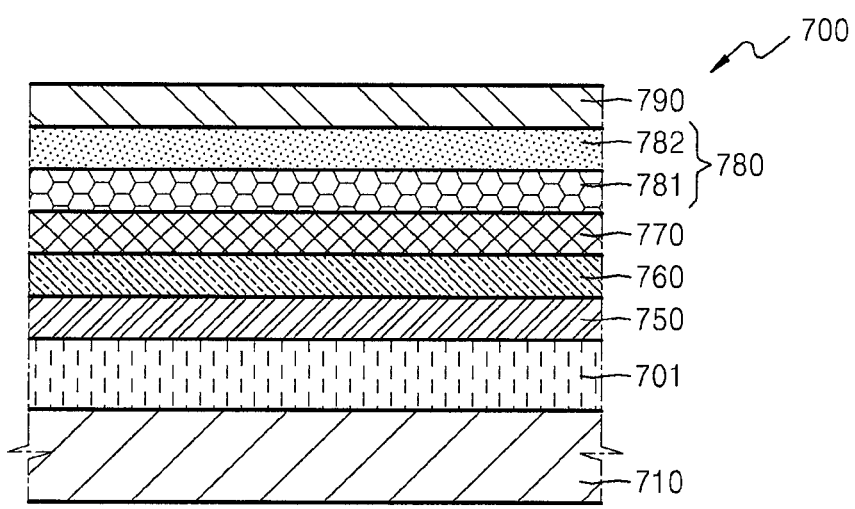

FIG. 14 is a schematic cross-sectional view of an organic light-emitting display apparatus 700 according to another embodiment of the present invention.

Referring to FIG. 14, a quarter wave plate 760, a first polarization plate 770, a biaxial plate 781, a C-plate 782, and a second polarization plate 790 are sequentially stacked on an organic light-emitting device 701.

The quarter wave plate 760 and the first polarization plate 770 are arranged so that an angle between a slow axis of the quarter wave plate 760 and an absorbing angle of the first polarization plate 770 may be about 45 degrees.

An angle between absorbing axes of the first polarization plate 770 and the second polarization plate 790 may be about 0 degrees. An angle between a slow axis of the biaxial plate 781 and the absorbing axis of each of the first polarization plate 770 and the second polarization plate 790 may be in a range from about 0 degrees to about 90 degrees, and, in one embodiment, is at about 90 degrees.

In this case, an in-plane retardation value Rin of the biaxial plate 781 may be in a range from about 50 nm to about 200 nm, in particular, about 100 to about 120 nm. A thickness retardation value Rth of the C-plate 782 may be in a range from about 50 nm to about 300 nm.

Eighth Embodiment

Figure 15:
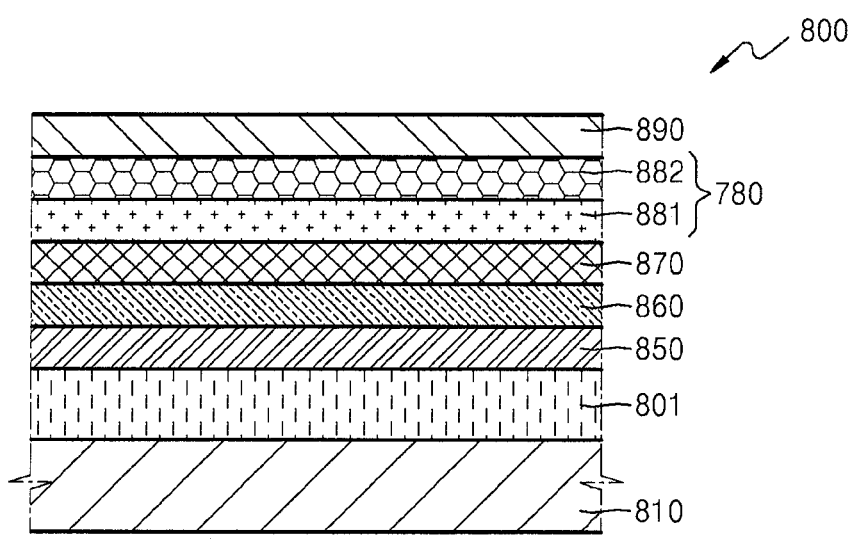

FIG. 15 is a schematic cross-sectional view of an organic light-emitting display apparatus 800 according to another embodiment of the present invention.

Referring to FIG. 15, a quarter wave plate 860, a first polarization plate 870, an A-plate 881, a biaxial plate 882, and a second polarization plate 890 are sequentially stacked in the stated order on an organic light-emitting device 801.

An angle between a slow axis of the A-plate 881 and the absorbing axis of each of the first polarization plate 870 and the second polarization plate 890 may be about 45 degrees. An angle between the biaxial plate 882 and the slow axis of the A-plate 881 may be about 90 degrees. That is, an angle between the slow axis of the biaxial plate 882 and the absorbing axis of each of the first polarization plate 870 and the second polarization plate 890 may be about 135 degrees.

In this case, an angle between the A-plate 881 and the absorbing axis may be about 135 degrees, and an angle between the biaxial plate 882 and the absorbing axis may be about 45 degrees.

However, an angle between the A-plate 881 and the biaxial plate 882 is not limited to the above-described angle.

An in-plane retardation value Rin of the A-plate 881 may be in a range from about 150 nm to about 300 nm, in particular, about 200 to about 250 nm. An in-plane retardation value Rin of the biaxial plate 882 may be in a range from about 50 nm to about 300 nm, in particular, about 100 to about 120 nm. Nz may be in a range from about 1 to about 2, in particular, 1.8.

So far, top emission type organic light-emitting display apparatuses have been described, but the present invention is not limited thereto. Embodiments of the present invention may be applied to a bottom emission type organic light-emitting display apparatus in which light is emitted towards a substrate.

As descried above, in the organic light-emitting display apparatuses according to one or more embodiments of the present invention, color shift at side-view angles may be compensated for by an optical compensation member, thereby increasing a viewing angle.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
    an organic light-emitting device comprising a pixel electrode, an opposite electrode facing the pixel electrode, and an organic light-emitting layer interposed between the pixel electrode and the opposite electrode;
    a first polarization plate disposed on a surface of the organic light-emitting device, the organic light-emitting device being configured to emit light through the first polarization plate;
    a second polarization plate facing the first polarization plate, wherein an angle between an absorbing axis of the first polarization plate and an absorbing axis of the second polarization plate is about zero degrees; and
    an optical compensation member between the first polarization plate and the second polarization plate.

2. The organic light-emitting display apparatus of claim 1, further comprising a phase retardation layer interposed between the organic light-emitting device and the first polarization plate.

3. The organic light-emitting display apparatus of claim 2, wherein the phase retardation layer comprises a single quarter wave plate.

4. The organic light-emitting display apparatus of claim 2, wherein the phase retardation layer comprises a single quarter wave plate and a single half wave plate.

5. The organic light-emitting display apparatus of claim 2, further comprising an encapsulation member between the organic light-emitting device and the phase retardation layer.

6. The organic light-emitting display apparatus of claim 1, wherein the optical compensation member comprises at least one selected from the group consisting of an A-plate, a C-plate, a biaxial plate, and combinations thereof.

7. The organic light-emitting display apparatus of claim 6, wherein the optical compensation member comprises two A-plates.

8. The organic light-emitting display apparatus of claim 7, wherein the two A-plates are orthogonal to each other, and an in-plane retardation value of each of the two A-plates is in a range from about 150 nm to about 300 nm.

9. The organic light-emitting display apparatus of claim 6, wherein the optical compensation member comprises a single A-plate.

10. The organic light-emitting display apparatus of claim 9, wherein an in-plane retardation value of the A-plate is in a range from about 500 nm to about 700 nm.

11. The organic light-emitting display apparatus of claim 6, wherein the optical compensation member comprises a single C-plate.

12. The organic light-emitting display apparatus of claim 11, wherein a thickness retardation value of the C-plate is in a range from about 150 nm to about 250 nm.

13. The organic light-emitting display apparatus of claim 6, wherein the optical compensation member comprises a single biaxial plate.

14. The organic light-emitting display apparatus of claim 13, wherein an in-plane retardation value of the biaxial plate is in a range from about 100 nm to about 150 mm.

15. The organic light-emitting display apparatus of claim 6, wherein the optical compensation member comprises two biaxial plates.

16. The organic light-emitting display apparatus of claim 15, wherein the two biaxial plates are orthogonal to each other, and an in-plane retardation value of each of the two biaxial plates is in a range from about 50 nm to about 300 nm.

17. The organic light-emitting display apparatus of claim 6, wherein the optical compensation member comprises a single A-plate and a C-plate that are sequentially disposed along a direction away from the organic light-emitting device.

18. The organic light-emitting display apparatus of claim 6, wherein the optical compensation member comprises a single biaxial plate and a single C-plate that are sequentially disposed along a direction away from the organic light-emitting device.

19. The organic light-emitting display apparatus of claim 6, wherein the optical compensation member comprises a single A-plate and a single biaxial plate that are sequentially disposed along a direction away from the organic light-emitting device.

* * * * *